United States Patent [19]

Merewether

[11] Patent Number: 4,677,251
[45] Date of Patent: Jun. 30, 1987

[54] VOLTAGE DIVIDING SHIELDED DOOR SEAL

[76] Inventor: David E. Merewether, 4305 Tulane Dr., NE., Albuquerque, N. Mex. 87107

[21] Appl. No.: 571,365

[22] Filed: Jan. 16, 1984

[51] Int. Cl.$^4$ .............................................. H05K 9/00
[52] U.S. Cl. .............................................. 174/35 MS
[58] Field of Search ............ 49/483, 488; 174/35 MS, 174/35 GC; 219/10.55 D; 343/18 A

[56] References Cited

U.S. PATENT DOCUMENTS

| | | |
|---|---|---|
| 1,134,209 | 4/1915 | Lane . |
| 2,405,987 | 8/1946 | Arnold . |
| 2,765,362 | 10/1956 | Lindgren . |
| 2,853,541 | 9/1958 | Lindgren . |
| 2,860,176 | 11/1958 | Lindgren . |
| 3,009,984 | 11/1961 | Lindgren . |
| 3,055,969 | 9/1962 | Schaller, Jr. . |
| 3,504,095 | 3/1970 | Roberson et al. . |
| 3,507,974 | 4/1970 | Clark et al. . |
| 3,589,070 | 6/1971 | Hansen . |
| 3,668,357 | 6/1972 | Kobayashi ................. 219/10.55 D |
| 3,736,399 | 5/1973 | Jarvis ......................... 174/35 GC X |
| 4,046,983 | 9/1977 | Ishino et al. ................ 219/10.55 D |
| 4,069,618 | 1/1978 | Geiss . |
| 4,102,041 | 7/1978 | Copping et al. ........ 219/10.55 D X |
| 4,370,831 | 2/1983 | Hamilton . |

Primary Examiner—Arthur T. Grimley
Assistant Examiner—D. A. Tone
Attorney, Agent, or Firm—Hoffman, Wasson & Fallow

[57] ABSTRACT

A door seal used in shielded enclosures for ensuring that high and low frequency electromagnetic waves are not allowed to pass through the shielded enclosure. One portion of the door seal contains a cavity having a dielectric material therein. Additionally, a small gap is provided in the periphery surrounding the cavity such that a voltage dividing network is established in the door seal for attenuating the effect of any high frequency or low frequency electromagnetic wave which would pass in either direction through the seal.

12 Claims, 6 Drawing Figures

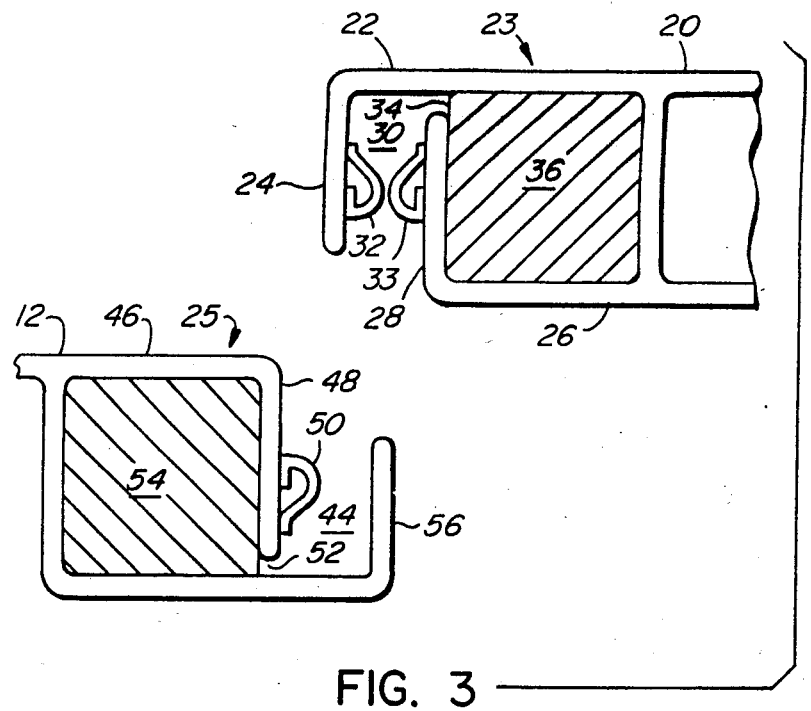
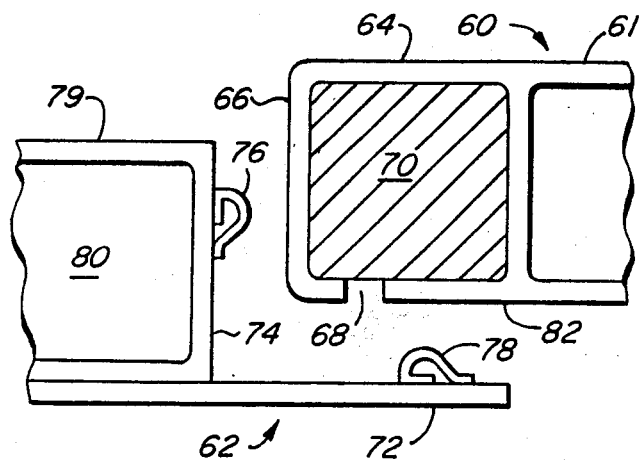
FIG. 3
FIG. 4

VOLTAGE DIVIDING SHIELDED DOOR SEAL

BACKGROUND OF THE INVENTION

The prior art is replete with various devices for ensuring that radio frequency or electromagnetic waves do not penetrate into or out of a sealed enclosure. Early prior art devices were designed to try to protect highly sensitive computers by preventing radio frequency and electromagnetic waves from entering a sealed enclosure containing the computer equipment. Due to the classified nature of the programs which various computers utilize, and the use to which they are directed, later patents directed to shielding a particular environment were drawn to various methods and devices for preventing electromagnetic or radio frequency waves from being transmitted from the shielded enclosure to the outside environment. these devices were important because highly sophisticated methods were being developed to eavesdrop on highly confidential governmental communications and operations.

Recently, a new problem has presented itself in the form of an extremely high frequency electromagnetic pulse which is produced by the detonation of a nuclear blast high in the atmosphere. This problem is documented in the January/February 1983 issue of *Science* magazine (pp. 41–49) wherein the deleterious effects of this electromagnetic pulse are described with respect to the problems which are imposed upon communications ystems and shielded enclosures. These high frequency electromagnetic waves could play havoc with the classified material contained in computers which is to be protected in the enclosed environment.

The majority of prior art devices, which have dealt with ensuring that radio frequency or electromagnetic waves do not penetrate into or exit from the sealed environment, generally protect the environment from relatively low frequencies of radiation, but does not afford comparable attenuation levels at microwave frequencies. As the computational speed of modern digital computers has increased so has the frequency content of electromagnetic emanations from these computers and digital communications systems. Therefore, a door seal that is more effective at microwave frequencies is required to protect the classified material being processed within a shielded enclosure.

It has been established that the voltage drop across the seal on the inside surface of all shielded enclosure or equipment access doors is an important consideration when designing a seal which would protect a shielded enclosure from the egress of very high frequency electromagnetic waves through the shielded door. In this context, all of these doors require exremely good metal-to-metal contact around their periphery.

Prior art patents which have dealt with this problem of providing an adequate door seal employ beryllium copper or phosphor bronze spring fingers within the door seal. Such prior art door seals are described in U.S. Pat. Nos. 3,589,070 issued to Hansen and 4,069,618 issued to Geiss. Both of these patents describe door seals used is shielded enclosures. These patents employ a knife edge provided on a first closure member which cooperates with spring fingers provided on a second closure member to form a door seal for screen rooms and shielded enclosures. While it has been shown that the door seal configurations shown in the Hansen and Geiss patents are quite effective in forming a good closure at low frequencies, at very high frequencies in excess of 0.5 GHz, the inductance of the tines of the spring fingers increases and the leakage through the slots formed in the door seal increases, thereby decreasing the effectiveness of the door seal.

The patent to Geiss also uses a woven metallic RF gasket in the area of cooperation between the knife edge and the spring fingers. This gasket introduces another low frequency current path in parallel with the two rows of spring fingers thereby reducing the voltage drop across the door seal. Secondly, the presence of this gasket increases the microwave attenuation of the door seal by acting as another barrier to the microwave energy. This material does not have the resilience of the beryllium copper spring fingers and ultimately it will "take a set" and added attenuation of the waves will be lost.

While different RF absorbing materials can be used between the rows of spring fingers to improve the microwave attenuation of the dor seal, the limited space between the spring fingers of approximately one centimeter limits the effectiveness of the door seal.

Consequently, it is seen that there is a continuing need for a more effective door seal which would block both low frequency electromagnetic waves as well as very high frequency electromagnetic waves.

SUMMARY OF THE INVENTION

The present invention is directed to improving the sealing effectiveness of a door seal for a shielded enclosure by introducing a high frequency impedance between the two coacting surfaces of the door seal. The door seal is provided with two coopeating members which move relative to one another. At least one of the members contains a small cavity therein which is filled with a dielectric or lossy material. The periphery surrounding the cavity is closed, with the exception of a small gap ensuring communication between the material provided within the cavity and a sealing surface between the two cooperating members. The combination of this gap and the dielectric material introduces a high frequency impedance between the surfaces of the seal. This impedance results in a voltage dividing action and reduces the voltage across the protected surface of the door seal.

Other objects, advantages and novel features of the present invention will become apparent from the following detailed description of the invention when considered in conjunction with the accompanying drawings, wherein like reference numerals identify like parts throughout.

BRIEF DESCRIPTION OF THE DRAWINGS

FIGS. 3, 4 and 5 are cutaway views of different embodiments of the present invention showing the relationship of the first and second closure members.

DETAILED DESCRIPTION OF THE DRAWINGS

Figure 1:
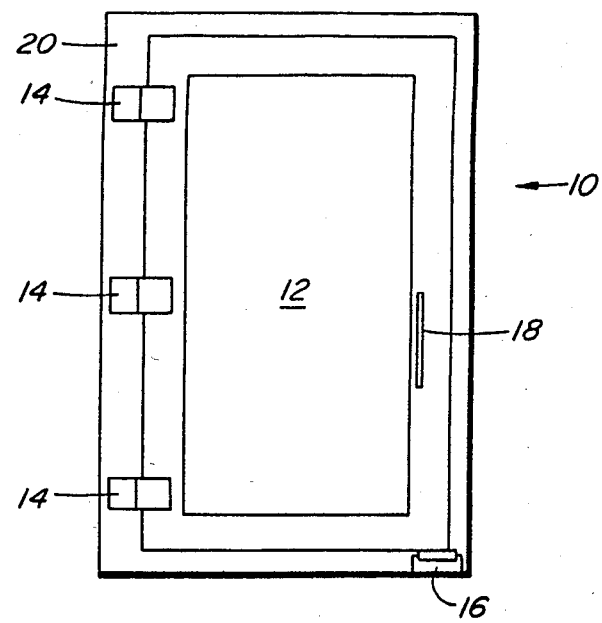
FIG. 1 is a front iew of the door which is used in a shielded enclosure.

FIG. 1 illustrates a typical door/door frame combination 10 which can be utilized with the door seal described in the present invention. The combination contains a door 12 provided with a door core constructed of virtually any standard door core materials such as wood, aluminum, steel or the like. The door core is surrounded by a layer of 26 gauge galvanized steel and can be provided with a color-coordinated decorative veneer or acoustical covering provided on both the inside and outside of the door core. A plurality of knuckle ball bearing hinges 14 is provided between the door 12 and door frame 20 to allow opening and closing of the door. Although three knuckle ball bearing hinges are shown in FIG. 1, it is understood that this number is merely illustrative of the number and positioning of the hinges which are utilized. An alignment bearing 16 is provided to ensure that the door will easily be opened and closed while ensuring that radiation cannot enter or leave the shielded enclosure. A polished chrome door handle 18 is provided to allow access to the interior of the enclosure. A similar handle is provided on the inside door in the enclosure. The door frame 20 can be constructed of standard materials which are used to prevent the passage of radiation into a sealed enclosure. The frame can be constructed with a four inch depth tubing frame having shielded lapp joints, but the invention is not to be construed to be limited to such a construction.

Figure 2:
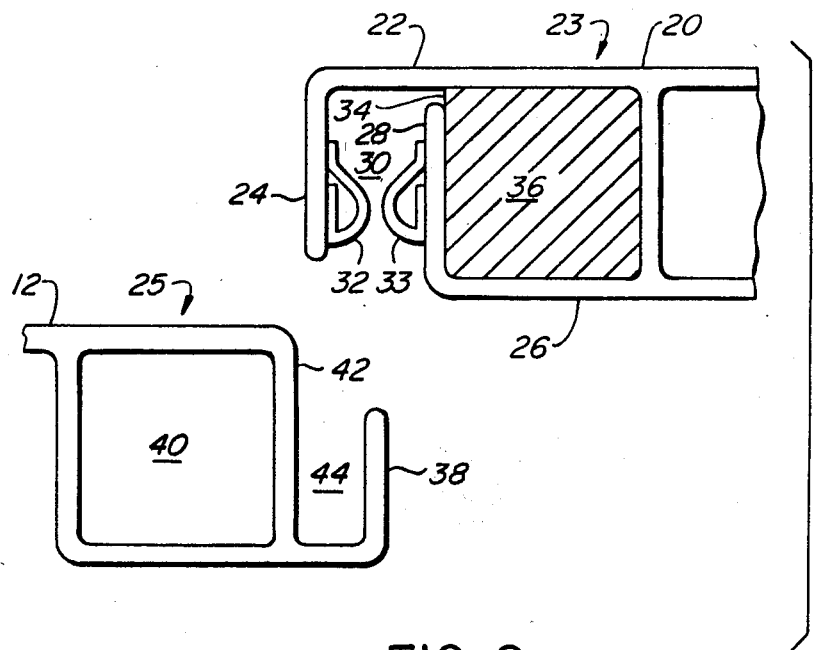
FIG. 2 is a cutaway view of one embodiment of the door seal of the present invention showing the relationship of the first and second closure members.

FIG. 2 shows a cutaway view of one embodiment of the present invention showing the various components of the door seal in an open position. The door seal is provided with a first closure member 23 secured to the door frame 20 and a second closure member 25 secured to the door 12. The first closure member 23 provided in the door frame 20 contains an L-shaped member having legs 22 and 24. A second L-shaped member having legs 26 and 28 is also provided. The legs 24 and 28 are opposed to one another and are arranged such that a slot 30 is provided therein. Altough it is not important for this invention, these L-shaped members can be constructed of material such as hot-rolled steel. A gap 34 is provided within the slot 30 and between legs 22 and 28 of the two L-shaped members. A cavity 36 is provided between the legs 22, 26 and 28 within which is provided a dielectric or lossy material such as polyurethane. Additionally, although it is not imperative to the operation of the present invention, te dielectric or lossy material can include conductive particles of copper or iron or any other material used to attenuate RF or electromagnetic waves. Although the exact dimensions of the gap 34 are not important, it has been found that a dimension of between four and eight millimeters can be provided. It is important to note that the gap 34 must be provided such that there is communicaton between the slot 30 and the dielectric material within the cavity 36. a pair of spring fingers 32, 33 is provided on the surface of the opposed members 24 and 28, respectively. These spring fingers can be constructed out of beryllium copper or phosphor bronze or any other similar material.

The second closure member 25 is provided on the door 12 and is provided with an L-shaped member 42 directly joined to a knife edge 38. A slot 44 is provided between L-shaped member 42 and the knife edge 38. The door core 40 is provided adjacent to the slot 44 and can be constructed of various materials, as has been indicated hereinabove.

In operation, the door 12 is swung closed such that knife edge 38 is provided between the resilient spring fingers 32,33 to ensure that an effective seal has been made. Although the door seal has been described as having a knife edge provided on the door and spring fingers provided on the door frame, the positioning of these elements can be reversed. Additionally, either side of the seal can be outside of the door. Furthermore, both the first and second closure members 23,25 are provided along the entire periphery of the door 12 at the door frame 20.

Figure 6:
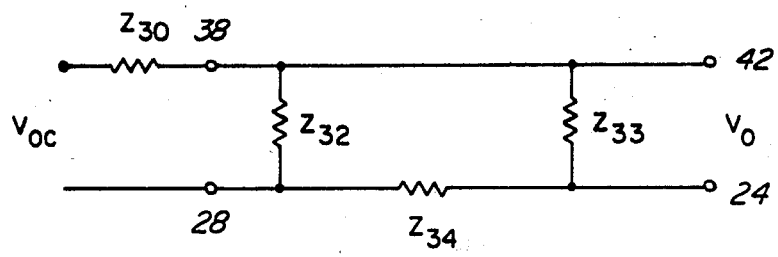
FIG. 6 is the equivalent circuit for the present invention with respect to the door seal shown in FIG. 2.

The operation of this seal can best be explained using the Thevenin equivalent circuit shown in FIG. 6. For illustrative purposes, consider that a plane wave field is incident from the bottom of FIG. 2 upward toward the seal. Without any spring fingers 32,33 in the assembly, a large voltage $V_{oc}$ would appear between the knife edge 38 and leg 28, as shown in FIGS. 2 and 6. With the spring fingers 32, 33 in place, the voltage between the knife edge 38 and the leg 28 is reduced to only the voltage drop across the contacts of the spring fingers. Since the impedance of the spring finger is much lower than the equivalent impedance of the slot $Z_{30}$, the output voltage $V_o$ is much smaller than the voltage $V_{oc}$. In a shielded door it is this reduction that is responsible for the effectiveness of the door seal.

In the present design, the voltage can be reduced further. It is apparent that the voltage between the knife edge 38 and leg 28 is the sum of the voltages between the knife edge 38 and the leg 24 and the voltage between the leg 24 and the leg 28. According to the equivalent circuit in FIG. 6, the voltage between the knife edge 38 and leg 28 is applied to the series combination of the impedance $Z_{32}$ of the spring finger 32 and the impedance $Z_{34}$ across the gap 34.

Since the impedances $Z_{33}$ and $Z_{32}$ are small, the impedance $Z_{34}$ does not have to be very large to reduce the voltage across the knife edge 38 and leg 24 significantly. Since this voltage drives the fields inside the enclosures, the improved shield effectiveness is obtained by introducing the gap 34 and the dielectric material within the cavity 36. Since the dimensions of the cavity, and the electrical conductivity, permittivity and permeability of the material contained in the cavity can be varied, the performance characteristics of the present invention can be changed.

FIG. shows an alternate embodiment of the present invention wherein both the first and second closure members 23 and 25 respectively include gaps such that dielectric material provided in each of the closure members can commuicate with the door seal. The first closure member 23 is similar to the embodiment shown in FIG. 2 and the same reference numerals are utilized. The second closure member 25 is provided on the door frame and includes an L-shaped member having legs 46 and 48 whichare used to substantially enclose a cavity 54 having dielectric material similar to the material contained in cavity 36 provided therein. Similar to the seal shown in FIG. 2, a knife edge 56 is provided which will cooperate with the spring fingers 32 and 33 in the manner which has been described hereinabove, and the slot 44 is provided between leg 48 and the knife edge 56. A single spring member 50 is provided on the leg 48 which is to coopeate with the outside surface of the leg 24 of the first closure member 23. Additionally, similar to the gap 34 which is provided in the first closure member, a gap 52 is provided between leg 48 and the continuation of the knife edge 56 allowing communication between the door seal and the dielectric material 54. As was true with respect to the embodiment shown in FIG. 2, the reversal of the first and second closure members on the door itself and the door frame is also contemplated.

FIG. 4 shows a third embodiment of the present invention which can be applied to a wiping/compression finger stock door seal having a first closure member 60 and a second closure member 62. The first closure member 60 is applied to the door frame 61 and substantially encloses a cavity 70 having dielectric material therein. The cavity 70 is surrounded by leg members 64, 66 and 82, except for a small gap 68 provided in leg member 82. The second closure member 62 is secured to the door 79 and is provided with a leg 74 having a spring finger 76 thereon, and a leg 72 having a spring finger 78 thereon. Conventional door core material is provided at 80. In operation, the gap 68 would cooperate with a sealing surface to ensure that the voltage dividing effect described hereinabove will also be present in this embodiment. As was true with respect to the previous embodiments, the first and second closure members can be reversed with respect to the positioning on the door frame or the door itself.

Figure 5:
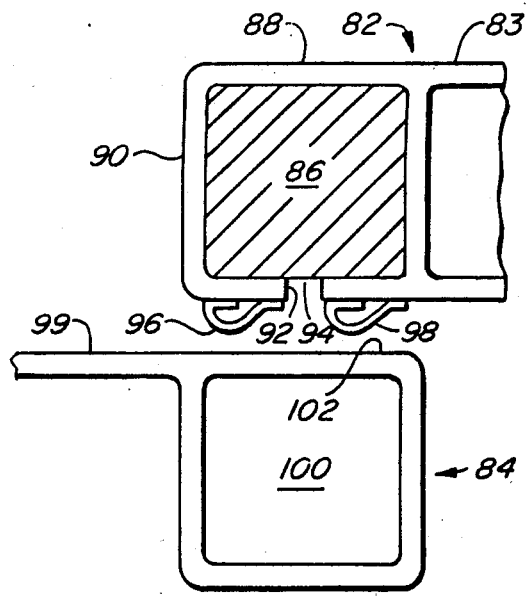

Yet another embodiment of the present invention is shown in FIG. 5. This embodiment illustrates the voltage dividing door seal applied to a compression door. The door seal includes a first closure member 82 secured to the door frame 83 and a second closure member 84 secured to the door 99. The first closure member contains legs 88, 90 and 92 which substantially surround a cavity 86 created therein. The cavity contains dielectric material similar to that which has been described with respect to the other embodiments of the present invention. The leg 92 is provided with a gap 94 such that the dielectric material can communicate with the door seal. As was true with respect to the gap provided in all of the embodiments of the present invention, this gap can be dimensioned between four and eight millimeters. Spring fingers 96 and 98 are each provided onone side of the gap which would cooperate with a sealing surface 102 on the second closure member 84. A door core 100 is provided which is constructed of conventional door core material. As was true with respect to all of the other embodiments of the present invention, the positioning of the first closure member 82 and the second closure member 84 can be reversed with respect to the door frame and the door itself.

Other features, advantages, characteristics, alternatives, modifications and variations of the present invention will be apparent to those skilled in the art, and such may be made by those skilled in the art within the spirit and scope of the present invention.

What is claimed is:

1. an electromagnetic shielded door seal utilized with a shielded enclosure adapted for use between a door and a door frame, said door seal comprising:
    first closure seal member fixedly attached to said door provided with a pair of first spaced wall members forming a first slot therebetween;
    second closure seal member fixedly attached to said door frame provided with a pair of second spaced wall members forming a second slot therebetween, one of said second wall members adapted to be inserted into said first slot and operatively coopeating with said first closure seal member to form an RF electromagnetic frequency resistant seal;
    a first cavity provided in said first closure seal member, said cavity filled with an energy absorbent dielectric material, said first cavity substantially enclosed with the exception of a distinct first gap provided in a surrounding periphery of said first cavity, said first gap directly opening onto said first slot; and
    first and second spring closure members provided respectively on each of said first pair of spaced wall members, said first and second spring closure members resiliently urged against the said second spaced wall member which is inserted into said first slot.

2. The electromagnetic shielded door seal in accordance with claim 1 further including:
    a second cavity provided in said second closure seal member filled with an energy absorbent dielectric material, said second cavity substantially enclosed with the exception of a distinct second gap provided in a surrounding periphery of said second cavity, said second gap directly opening onto said second slot; and
    third spring closure provided on the said second spaced wall member which is not inserted into said first slot, said third spring closure resiliently urged against one of said spaced wall members when the said second spaced wall member is inserted into said first slot.

3. The electromagnetic shielded door in accordance with claim 2 wherein said first and second cavities are completely filled with an energy absorbent dielectric material.

4. An electromagnetic shielded door seal utilized with a shielded enclosure adapted for use between a door and a door frame, said door seal comprising:
    first closure seal member fixedly attached to said door frame provided with a pair of first spaced wall members forming a first slot therebetween;
    second closure seal member fixedly attached to said door provided with a pair of second spaced wall members forming a second slot therebetween, one of said second wall members adapted to be inserted into said first slot and operatively cooperating with said first closure seal member to form an RF electromagnetic frequency resistant seal;
    a first cavity provided in said first closure seal member, said cavity filled with an energy absorbent dielectric material, said first cavity substantially enclosed with the exception of a distinct first gap provided in a surrounding periphery of said first cavity, said first gap directly opening onto said first slot; and
    first and second spring closure members provided respectively on each of said first pair of spaced wall members, said first and second spring closure members resiliently urged against the said second spaced wall member which is inserted into said first slot.

5. The electromagnetic shielded door seal in accordance with claim 4 further including:
    a second cavity provided in said second closure seal member filled with an energy absorbent dielectric material, said second cavity substantially enclosed with the exception of a distinct second gap provided in a surrounding periphery of said second cavity, said second gap directly opening onto said second slot; and
    third spring closure provided on the said second spaced wall member which is not inserted into said first slot, said third spring closure resiliently urged against one of said spaced wall members when the said second spaced wall member is inserted into said first slot.

6. The electromagnetic shielded door in accordance with claim 5 wherein said first and second cavities are completely filled with an energy absorbent dielectric material.

7. An electromagnetic door seal utilized with a shielded enclosure adapted for use between a door and a door frame comprising:
   first closure seal member fixedly attached to said door;
   second closure seal member fixedly attached to said door frame operatively cooperating with said first closure seal member to form an RF or electromagnetic frequency resistant seal;
   a cavity provided in said first closure seal member filled with an energy absorbent dielectric material, said cavity substantially enclosed with the exception of a distinct gap provided in a surrounding periphery of said cavity, said gap provided on the portion of said periphery of said cavity directly facing and opening onto said second closure member; and
   first and second spring closure members provided on said surrounding periphery of said first closure seal member on either side of said gap.

8. An electromagnetic door seal utilized with a shielded enclosure adapted for use between a door and a door frame comprising:
   first closure seal member fixedly attached to said door;
   second closure seal member provided with an L-shaped sealing surface, said second closure means fixedly attached to said door frame and operatively cooperating with said first closure seal member to form an RF or electromagnetic frequency seal;
   a cavity provided in said first closure seal member filled with an energy absorbent dielectric material, said cavity substantially enclosed with the exception of a distinct gap provided in a surrounding periphery of said cavity, said gap provided on the portion of said periphery of said cavity directly facing and opening onto said second closure member; and
   first spring closure member provided on one of the L-shaped legs of said L-shaped sealing surface and a second spring closure member provided on the second leg of said L-shaped sealing surface.

9. The electromagnetic shielded door in accordance with claim 8 wherein said cavity is completely filled with an energy absorbent dielectric material.

10. An electromagnetic door seal utilized with a shielded enclosure adapted for use between a door and a door frame comprising:
    first closure seal member fixedly attached to said door frame;
    second closure seal member fixedly attached to said door operatively cooperating with said first closure seal member to form an RF or electromagnetic frequency resistant seal;
    a cavity provided in said first closure seal member filled with an energy absorbent dielectric material, said cavity substantially enclosed with the exception of a distinct gap provided in a surrounding periphery of said cavity, said gap provided on the portion of said periphery of said cavity directly facing and opening onto said second closure member; and
    first and second spring closure members provided on said surrounding periphery of said first closure seal member on either side of said gap.

11. The electromagnetic shielded door in accordance with claim 10 wherein said cavity is completely filled with an energy absorbent dielectric material.

12. An electromagnetic door seal utilized with a shielded encloaure adapted for use between a door and a door frame comprising:
    first closure seal member fixedly attached to said door frame;
    second closure seal member provided with an L-shaped sealing surface, said second closure means fixedly attached to said door and operatively cooperating with said first closure seal member to form an RF or electromagnetic frequency seal;
    a cavity provided in said first closure seal member filled with an energy absorbent dielectric material, said cavity substantially enclosed with the exception of a distinct gap provided in a surrounding periphery of said cavity, said gap provided on the portion of said periphery of said cavity directly facing and opening onto said second closure member; and
    first spring closure member provided on one of the L-shaped legs of said L-shaped sealing surface and a second spring closure member provided on the second leg of said L-shaped sealing surface.

* * * * *